(12) United States Patent
Christenson et al.

(10) Patent No.: US 7,250,322 B2
(45) Date of Patent: Jul. 31, 2007

(54) METHOD OF MAKING MICROSENSOR

(75) Inventors: John C. Christenson, Kokomo, IN (US); Seyed R. Zarabadi, Kokomo, IN (US); Dan W. Chilcott, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 121 days.

(21) Appl. No.: 11/081,422

(22) Filed: Mar. 16, 2005

(65) Prior Publication Data

US 2006/0211161 A1 Sep. 21, 2006

(51) Int. Cl.
*H01L 21/00* (2006.01)

(52) U.S. Cl. .................... 438/50; 257/E21.683

(58) Field of Classification Search .............. 438/719, 438/735, 48
See application file for complete search history.

(56) References Cited

U.S. PATENT DOCUMENTS

| 2,912,657 | A | 11/1959 | Schaevitz | 336/30 |
|---|---|---|---|---|
| 2,916,279 | A | 12/1959 | Stanton | 264/1 |
| 4,435,737 | A | 3/1984 | Colton | 361/280 |
| 4,699,006 | A | 10/1987 | Boxenhorn | 73/517 |
| 4,736,629 | A | 4/1988 | Cole | 73/517 |
| 4,805,456 | A | 2/1989 | Howe et al. | 73/517 |
| 4,851,080 | A | 7/1989 | Howe et al. | 156/647 |
| 5,006,487 | A | 4/1991 | Stokes | 437/228 |
| 5,092,174 | A | 3/1992 | Reidemeister et al. | 73/517 |
| 5,146,389 | A | 9/1992 | Ristic et al. | 361/283 |
| 5,226,321 | A | 7/1993 | Varnham et al. | 73/505 |
| 5,233,213 | A | 8/1993 | Marek | 257/415 |
| 5,249,465 | A | 10/1993 | Bennett et al. | 73/510 |
| 5,251,484 | A | 10/1993 | Mastache | 73/517 |
| 5,253,526 | A | 10/1993 | Omura et al. | 73/517 |
| 5,310,450 | A | 5/1994 | Offenberg et al. | 156/630 |
| 5,314,572 | A | 5/1994 | Core et al. | 156/643 |

(Continued)

FOREIGN PATENT DOCUMENTS

SU 0583397 12/1977 ............. 73/517 A (Continued)

OTHER PUBLICATIONS

"Rejecting Rotational Disturbances on Small Disk Drives Using Rotational Accelerometers" Daniel Y. Abramovitch, 1996, IFAC World Congress in San Francisco, CA 1996, pp. 1-6.

(Continued)

*Primary Examiner*—Michael Lebentritt
*Assistant Examiner*—Elias Ullah
(74) *Attorney, Agent, or Firm*—Jimmy L. Funke

(57) ABSTRACT

A linear accelerometer is provided having a support substrate, fixed electrodes having fixed capacitive plates, and a movable inertial mass having movable capacitive plates capacitively coupled to the fixed capacitive plates. Adjacent capacitive plates vary in height. The accelerometer further includes support tethers for supporting the inertial mass and allowing movement of the inertial mass upon experiencing a linear acceleration along a sensing axis. The accelerometer has inputs and an output for providing an output signal which varies as a function of the capacitive coupling and is indicative of both magnitude and direction of vertical acceleration along the sensing Z-axis. A microsensor fabrication process is also provided which employs a top side mask and etch module.

19 Claims, 8 Drawing Sheets

U.S. PATENT DOCUMENTS

| | | | |
|---|---|---|---|
| 5,345,824 A | 9/1994 | Sherman et al. | 73/517 |
| 5,349,858 A | 9/1994 | Yagi et al. | 73/517 |
| 5,388,460 A | 2/1995 | Sakurai et al. | 73/517 |
| 5,417,111 A | 5/1995 | Sherman et al. | 73/517 |
| 5,431,050 A | 7/1995 | Yamada | 73/517 |
| 5,540,095 A | 7/1996 | Sherman et al. | 73/514 |
| 5,569,852 A | 10/1996 | Marek et al. | 73/514 |
| 5,578,755 A | 11/1996 | Offenberg | 73/514 |
| 5,618,989 A | 4/1997 | Marek et al. | |
| 5,665,915 A | 9/1997 | Kobayashi et al. | 73/514 |
| 5,707,077 A | 1/1998 | Yokota et al. | 280/735 |
| 5,731,520 A | 3/1998 | Stevenson et al. | 73/514 |
| 5,780,885 A | 7/1998 | Diem et al. | |
| 5,847,280 A | 12/1998 | Sherman et al. | 73/514 |
| 5,894,091 A | 4/1999 | Kubota | |
| 5,939,633 A | 8/1999 | Judy | |
| 6,000,280 A | 12/1999 | Miller et al. | |
| 6,000,287 A | 12/1999 | Menzel | 73/514 |
| 6,013,933 A | 1/2000 | Foerstner et al. | |
| 6,199,430 B1 | 3/2001 | Kano et al. | 73/514 |
| 6,257,062 B1 | 7/2001 | Rich | 73/514 |
| 6,428,713 B1* | 8/2002 | Christenson et al. | 216/2 |
| 6,508,124 B1 | 1/2003 | Zerbini et al. | 73/514 |
| 6,631,642 B2 | 10/2003 | Oguchi et al. | |
| 6,678,069 B1 | 1/2004 | Abe | |
| 6,679,995 B1 | 1/2004 | Banjac et al. | |
| 6,761,068 B1 | 7/2004 | Schmid | |
| 6,761,070 B2* | 7/2004 | Zarabadi et al. | 73/514.32 |
| 6,848,310 B2 | 2/2005 | Goto | |
| 6,990,864 B2 | 1/2006 | Sakai | |
| 2003/0140700 A1* | 7/2003 | Zarabadi et al. | 73/514.32 |
| 2003/0209076 A1 | 11/2003 | Miao et al. | |
| 2003/0210511 A1 | 11/2003 | Sakai et al. | |
| 2005/0235751 A1 | 10/2005 | Zarabadi et al. | |
| 2006/0201249 A1* | 9/2006 | Horning et al. | 73/504.14 |

FOREIGN PATENT DOCUMENTS

| | | | |
|---|---|---|---|
| SU | 1035523 | 8/1983 | 73/517 A |
| SU | 1040424 | 9/1983 | 73/517 A |
| WO | 02103369 | 12/2002 | |

OTHER PUBLICATIONS

"Increased Disturbance Rejection in Magnetic Disk Drives by Acceleration Feedforward Control and Parameter Adaption" M.T. White and M. Tomizuka, vol. 5, No. 6, 1997, pp. 741-751.

"Surface Micromachined Angular Accelerometer with Force Feedback" T.J. Brosnihan, A.P. Pisano and R.T. Howe; DSC-vol. 57-2, 1995, IMECE pp. 941-947.

"Embedded Interconnect and Electrical Isolation for High-Aspect-Ratio, SOI Inertial Instruments" T.J. Brosnihan, J.M. Bustillo, A.P. Pisano and R.T. Howe; 1997 International Conference on Solid-State Sensors and Actuators, Chicago, Jun. 16-19, 1997, pp. 637-640.

"A Z-Axis Differential Capacitive SOI Accelerometer with Vertical Comb Electrodes," Toshiyuki Tsuchiya, Hirofumi Funabashi; Department of Mechanical Engineering, Kyoto University, Japan, Feb. 20, 2004, 8 pages.

"A Scanning Micromirror with Angular Comb Drive Actuation," Pamela R. Patterson, Dooyoung Hah, Hung Nguyen, Hiroshi Toshiyoshi, Rum-min Chao and Ming C. Wu; Electrical Engineering Department, University of California at Los Angels, IEEE 2002, pp. 544-547.

"Self-Aligned Vertical Electrostatic Combdrives for Micromirror Actuation," Uma Krishnamoorthy, Daesung Lee and Olav Solgaard; Journal of Microelectromechanical Systems, vol. 12, No. 4, Aug. 2003, pp. 458-464.

"Large-Displacement Vertical Microlens Scanner with Low Driving Voltage," Sunghoon Kwon, Veljko Milanovic and Luke Lee; IEEE Photonics Technology Letters, vol. 14, No. 11, Nov. 2002, pp. 1572-1574.

"A Novel Fabrication Method of a Vertical Comb Drive Using a Single SOI Wafer for Optical MEMS Applications," Ki-Hun Jeong and Luke Lee, The 12th International Conference on Solid State Sensors, Actuators and Microsystems, Boston, Jun. 8-12, 2003, pp. 1462-1465.

\* cited by examiner

METHOD OF MAKING MICROSENSOR

CROSS-REFERENCE TO RELATED APPLICATION

This application is related to U.S. application Ser No. 11/081,427 entitled "LINEAR ACCELEROMETER," filed on the same date as the present application, the entire disclosure of which is hereby incorporated herein by reference.

TECHNICAL FIELD

The present invention generally relates to acceleration sensors (i.e. accelerometers) and, more particularly, relates to a micro-machined capacitively coupled linear accelerometer for sensing magnitude and direction of linear acceleration.

BACKGROUND OF THE INVENTION

Accelerometers are commonly employed to measure the second derivative of displacement with respect to time. In particular, linear accelerometers measure linear acceleration along a particular sensing axis. Linear accelerometers are frequently employed to generate an output signal (e.g., voltage) proportional to linear acceleration for use in any of a number of vehicle control systems. For example, the sensed output from a linear accelerometer may be used to control safety-related devices on an automotive vehicle, such as front and side impact air bags. According to other examples, accelerometers may be used in automotive vehicles for vehicle dynamics control and suspension control applications.

Conventional linear accelerometers often employ an inertial mass suspended from a support frame by multiple support beams. The mass, support beams and frame generally act as a spring mass system, such that the displacement of the mass is proportional to the linear acceleration applied to the frame. The displacement of the mass generates a voltage proportional to linear acceleration which, in turn, is used as a measure of the linear acceleration.

One type of an accelerometer is a micro-electromechanical structure (MEMS) sensor that employs a capacitive coupling between interdigitated fixed and movable capacitive plates that are movable relative to each other in response to linear acceleration. An example of a capacitive type single-axis linear accelerometer is disclosed in U.S. Pat. No. 6,761,070, entitled "MICROFABRICATED LINEAR ACCELEROMETER," the entire disclosure of which is hereby incorporated herein by reference. An example of a capacitive type dual-axis accelerometer is disclosed in U.S. application Ser. No. 10/832,666, filed on Apr. 27, 2004, entitled "DUAL-AXIS ACCELEROMETER," the entire disclosure of which is also hereby incorporated herein by reference.

Some conventional capacitive type accelerometers employ a vertical stacked structure to sense linear acceleration in the vertical direction. The stacked vertical structure typically has an inertial proof mass suspended between upper and lower fixed capacitive plates. The inertial proof mass moves upward or downward responsive to vertical acceleration. The measured change in capacitance between the proof mass and the fixed capacitive plates is indicative of the sensed acceleration. The vertical stacked structure employed in the aforementioned conventional linear accelerometer generally requires significant process complexities in the fabrication of the device using bulk and surface micro-machining techniques. As a consequence, conventional vertical sensing accelerometers typically suffer from high cost and undesired packaging sensitivity.

Additionally, the manufacturing process for fabricating conventional linear accelerometers typically involves a two-sided etch fabrication process which processes both the bottom and top of the patterned wafer. Conventional two-sided process fabrication typically uses a trench etching process, such as deep reactive ion etching (DRIE) and bond-etch back process. The etching process typically includes etching a pattern from a doped material suspended over a cavity to form a conductive pattern that is partially suspended over a cavity. The conventional etching processes typically require etching the patterned wafer from both the top and bottom sides. One example of a conventional etching approach is disclosed in U.S. Pat. No. 6,428,713, issued on Aug. 6, 2002, entitled "MEMS SENSOR STRUCTURE AND MICROFABRICATION PROCESS THEREFOR," which is hereby incorporated herein by reference. Another example of an accelerometer fabrication process is disclosed in U.S. Pat. No. 5,006,487, entitled "METHOD OF MAKING AN ELECTROSTATIC SILICON ACCELEROMETER," the entire disclosure of which is also hereby incorporated herein by reference.

The conventional two-sided fabrication process generally requires additional equipment to pattern and etch the top and bottom sides of two wafers and to achieve proper alignment and bonding of the two wafers. This equipment adds to the costs of the device. Additionally, since the patterned top and bottom wafers are aligned and bonded together, the device may suffer from misalignment and bond degradation.

Accordingly, it is therefore desirable to provide for a linear accelerometer and method of manufacturing a micro-machine microsensor that does not suffer undesired packaging sensitivity and other drawbacks of prior known sensors. In particular, it is desirable to provide for a cost-effective linear accelerometer that may sense vertical acceleration including both magnitude and direction of acceleration. It is further desirable to provide for a method of manufacturing a microsensor, such as a vertical linear accelerometer, that does not suffer from the above-described drawbacks of the prior known microsensor fabrication techniques.

SUMMARY OF THE INVENTION

In accordance with the teachings of the present invention, a method of making a microsensor is provided. The method includes the steps of forming at least one cavity in the top surface of a substrate and providing a device layer on top of the substrate extending over the cavity. The method also includes the step of forming at least one reduced height region in a top surface of the device layer using a mask and etch module. The mask and etch module etches material from the top surface of the device layer. The method further includes the step of forming one or more trenches in the device layer to form one or more components of a microsensor.

The method of making a microsensor advantageously employs a mask and etch module which allows for top side processing. Accordingly, a microsensor can be manufactured without requiring bottom side processing equipment and costs associated therewith. The method is particularly well-suited for manufacturing an accelerometer having capacitive plates, such as a linear accelerometer.

BRIEF DESCRIPTION OF THE DRAWINGS

The present invention will now be described, by way of example, with reference to the accompanying drawings, in which.

DESCRIPTION OF THE PREFERRED EMBODIMENTS

Linear Accelerometer

Referring to FIGS. 1–4, an accelerometer 10 is illustrated according to one embodiment of the present invention for sensing magnitude and direction of acceleration along at least one sensing axis, which is shown as the vertical Z-axis. The accelerometer 10 is shown and described herein as a single-axis linear bi-directional accelerometer for sensing linear acceleration in both upward and downward directions of the vertical Z-axis, according to one embodiment. The Z-axis extends perpendicular to the plane defined by the X- and Y-axes. Alternately, the accelerometer 10 may be employed as a multi-axis accelerometer for sensing acceleration in multiple axes. For example, the accelerometer 10 may be employed as a three-axis accelerometer for sensing linear acceleration in any of the X-, Y- and Z-axes. Further, it should be appreciated that the accelerometer 10 could be employed to sense angular acceleration or angular velocity, such as angular acceleration or angular velocity about the Z-axis, as well as linear acceleration along the vertical Z-axis.

Figure 2:
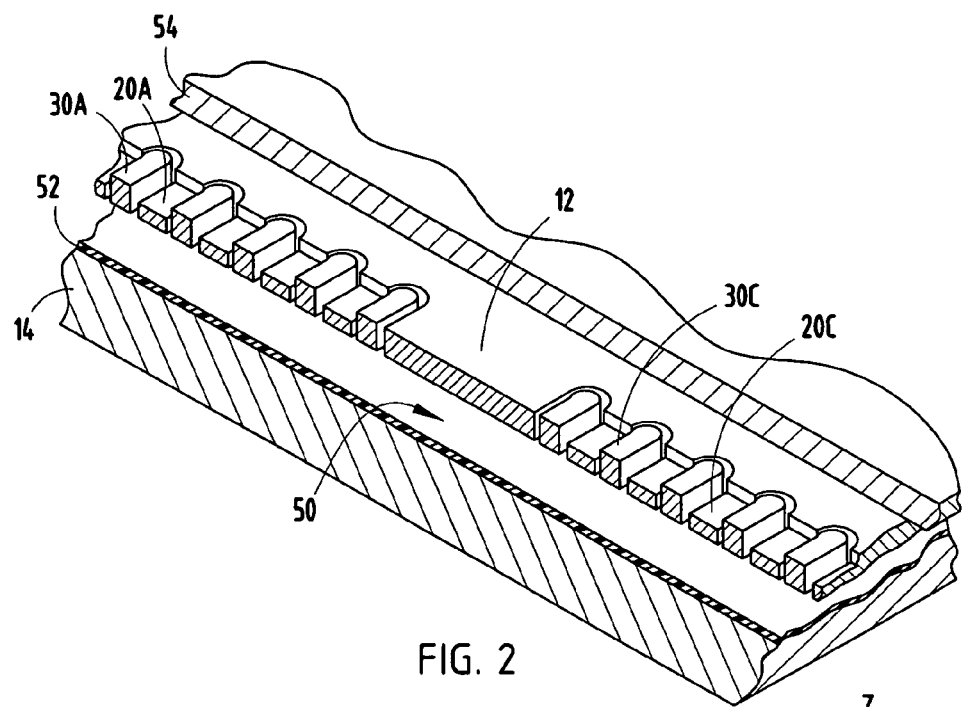
FIG. 2 is a partial cut away sectional view of the accelerometer taken through lines II—II of FIG. 1.
Figure 3:
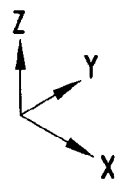
FIG. 3 is a partial cut away sectional view of the accelerometer taken through lines III—III of FIG. 1.
Figure 3:
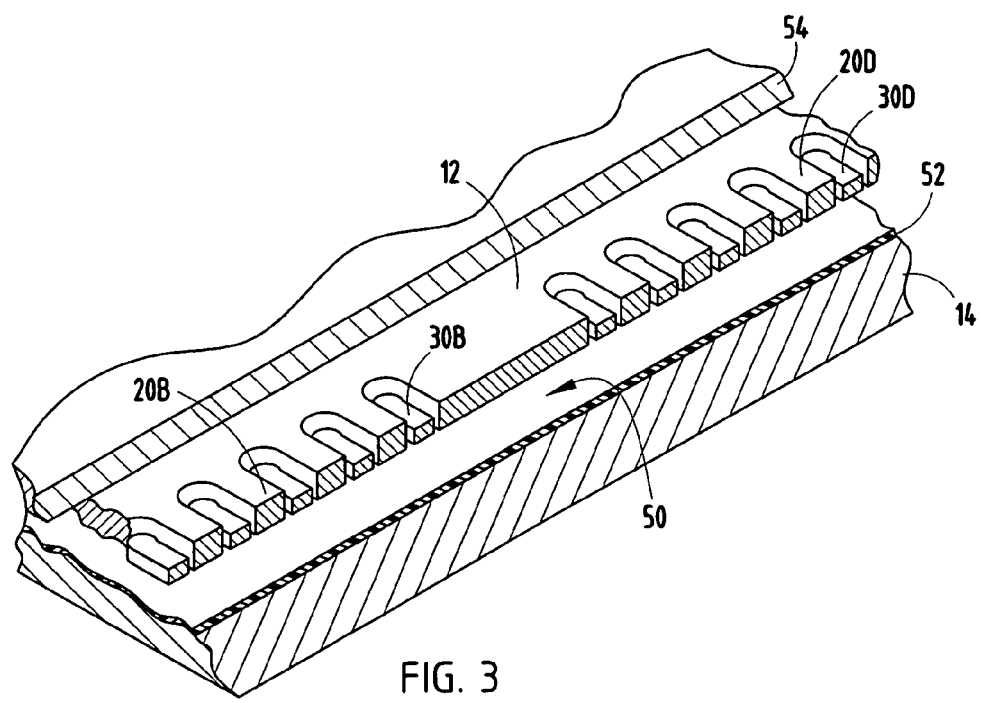

The bi-directional linear accelerometer 10 is a micromachined MEMS accelerometer formed with a top-side etching process described herein according to one embodiment. The linear accelerometer 10 is fabricated on a supporting substrate 14, which may include a silicon substrate, according to one embodiment. The substrate 14 may be formed from a handle wafer having a bond oxide layer 52 formed on the top surface. Various electrical and mechanical components of the device are formed in an epitaxial (EPI) device layer above the substrate 14. An overlying cover 54 is shown in FIGS. 2 and 3 positioned on top to enclose the accelerometer 10 to prevent contamination and damage, such as that caused by moisture and particles.

Figure 1:
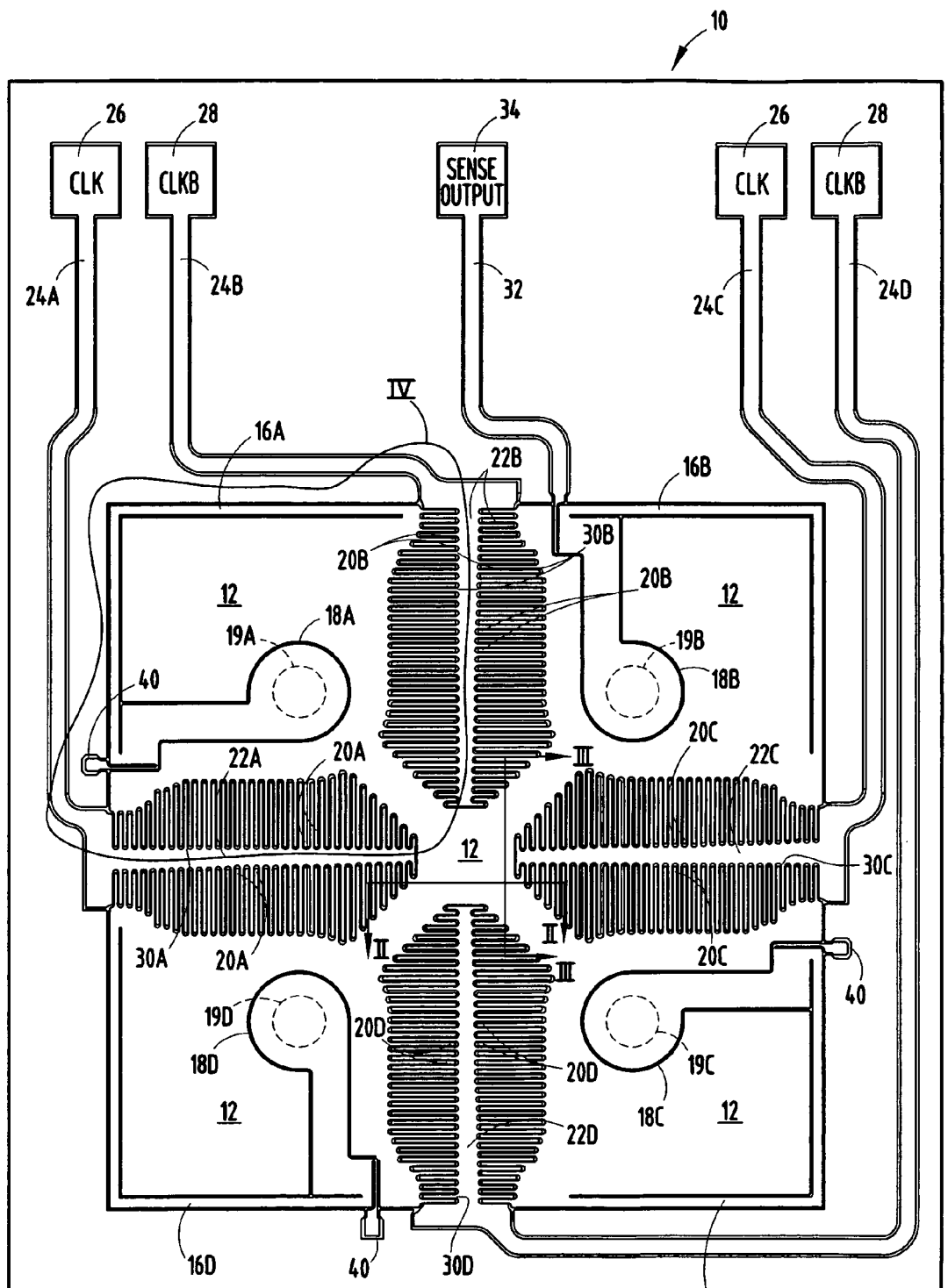
FIG. 1 is a top view of a linear accelerometer shown with the overlying cover removed according to one embodiment of the present invention.

Formed on top of the supporting substrate 14 is an inertial proof mass 12 which extends over a cavity 50. The inertial mass 12 is shown in FIG. 1 having a central portion extending to each of four corner quadrants. However, the inertial mass 12 may be formed in any of a number of shapes and sizes. Inertial mass 12 is suspended from the support substrate 14 via a support structure shown, which, according to the embodiment includes four bent generally L-shaped tethers 16A–16D, such that the inertial mass 12 is movable at least upward and downward relative to substrate 14 at least in a direction along the Z-axis when subjected to vertical acceleration. Tethers 16A–16D may have any appropriate shape.

The four generally L-shaped tethers 16A–16D extend between the inertial mass 12 at one end and support anchored cantilevers 18A–18D, respectively, at the other end. Support anchored cantilevers 18A–18D are rigidly fixed to and cantilevered from the substrate 14 by respective anchors 19A–19D which are shown by hidden lines. The tethers 16A–16D have a length, width, depth and shape selected to achieve a desired resilient spring structure that flexes to allow inertial mass 12 to move a distance within a desired range when subjected to vertical acceleration. Together, the inertial mass 12 and tethers 16A–16D act as a spring mass system. It should be appreciated any one or more supporting structures may be employed to support the mass 12 according to other embodiments. For example, four folded beam tethers could be employed.

The movable inertial mass 12 has a plurality of rigid comb-like conductive fingers 20A and 20B that form movable capacitive plates. The movable inertial mass 12 includes first and third movable capacitive plates 20A and 20C each extending lengthwise in a direction along the Y-axis, and second and fourth movable capacitive plates 20B and 20D each extending lengthwise in a direction along the X-axis. The inertial mass 12 with the comb-like conductive fingers (plates) 20A–20D forms a movable electrode that moves at least linearly in the sensing Z-axis when subjected to a vertical acceleration along the sensing Z-axis. For purposes of discussion herein, the X-axis and Y-axis are defined as shown oriented in FIG. 1, and the vertical Z-axis is defined as shown in FIGS. 2 and 3.

The linear accelerometer 10 also includes four fixed electrodes 22A–22D shown generally located at ninety degree (90°) increments. The fixed electrodes 22A–22D generally extend from and are fixed to the support substrate 14, and thus do not move relative to the support substrate 14. Each of the fixed electrodes 22A–22D includes a plurality of fixed capacitive plates 30A–30D, respectively, which are generally formed as a plurality of rigid comb-like conductive fingers. The fixed capacitive plates 30A–30D are formed to be interdigitated with the movable capacitive plates 20A–20D, respectively, to form four banks of variable capacitors. That is, the movable capacitive plates 20A–20D are oriented parallel to and interdigitated with the plurality of fixed capacitive plates 30A–30D, respectively, so that adjacent capacitive plates face each other in a juxtaposition such that a capacitive coupling is provided.

The first plurality of fixed capacitive plates 30A of the first fixed electrode 22A are interdisposed between adjacent first movable capacitive plates 20A of inertial mass (movable electrode) 12 generally in a first quadrant of the inertial mass 12. The first fixed electrode 22A has a signal input line 24A for receiving an input clocked signal CLK applied to input pad 26. The input signal CLK is a clocked signal, such as a square wave signal according to one embodiment. The capacitive plates 20A and 30A thereby form a first bank of variable capacitors.

The third fixed electrode 22C likewise includes a third plurality of fixed capacitive plates 30C interdisposed between adjacent third movable capacitive plates 20C of inertial mass 12 generally in the third quadrant of inertial mass 12 to provide a third bank of variable capacitors. The third fixed electrode 22C has a signal input line 24C for also receiving the input clocked signal CLK applied to input pad 26. The bank of variable capacitors formed by capacitive plates 20C and 30C is generally symmetric with the first bank of variable capacitors formed by capacitive plates 20A and 30A.

The second fixed electrode 22B includes a second plurality of fixed capacitive plates 30B interdisposed between adjacent second movable capacitive plates 20B generally in the second quadrant of inertial mass 12 to provide a second bank of variable capacitors. The second fixed electrode 22B has a signal input line 24B for receiving an input clocked signal CLKB applied to input pad 28. Clocked signal CLKB is one hundred eighty degrees (180°) out-of-phase, i.e., inverse, as compared to clocked signal CLK, according to one embodiment.

The fourth fixed electrode 22D includes fourth fixed capacitive plates 30D interdisposed between adjacent fourth movable capacitive plates 20D generally in the fourth quadrant of inertial mass 12 to provide a fourth bank of variable capacitors. The fourth fixed electrode 22D has a signal input line 24D for also receiving the input clocked signal CLKB applied to input pad 28. The fourth bank of variable capacitors is generally symmetric with the second bank of variable capacitors.

Fixed electrodes 22A–22D are electrically conductive and are electrically energized with out-of-phase input clocked signals CLK and CLKB. Clocked signals CLK and CLKB may include other out-of-phase signal waveforms, such as triangular or sine waveforms. Adjacent fixed electrodes 22A–22D are dielectrically isolated from each other via isolation trenches 40 within the structure.

The sensed signal output line 32 is electrically coupled to inertial mass (movable electrode) 12 via the second bent tether 16B. The output line 32 is further connected to output pad 34 for supplying thereto the sensed output voltage (charge). The sensed output signal is the sensed voltage generated on inertial mass 12 due to changes in capacitance in any of the four banks of variable capacitors caused by acceleration. The sensed output signal is further processed to determine the magnitude and direction of the sensed vertical acceleration.

Figure 4:
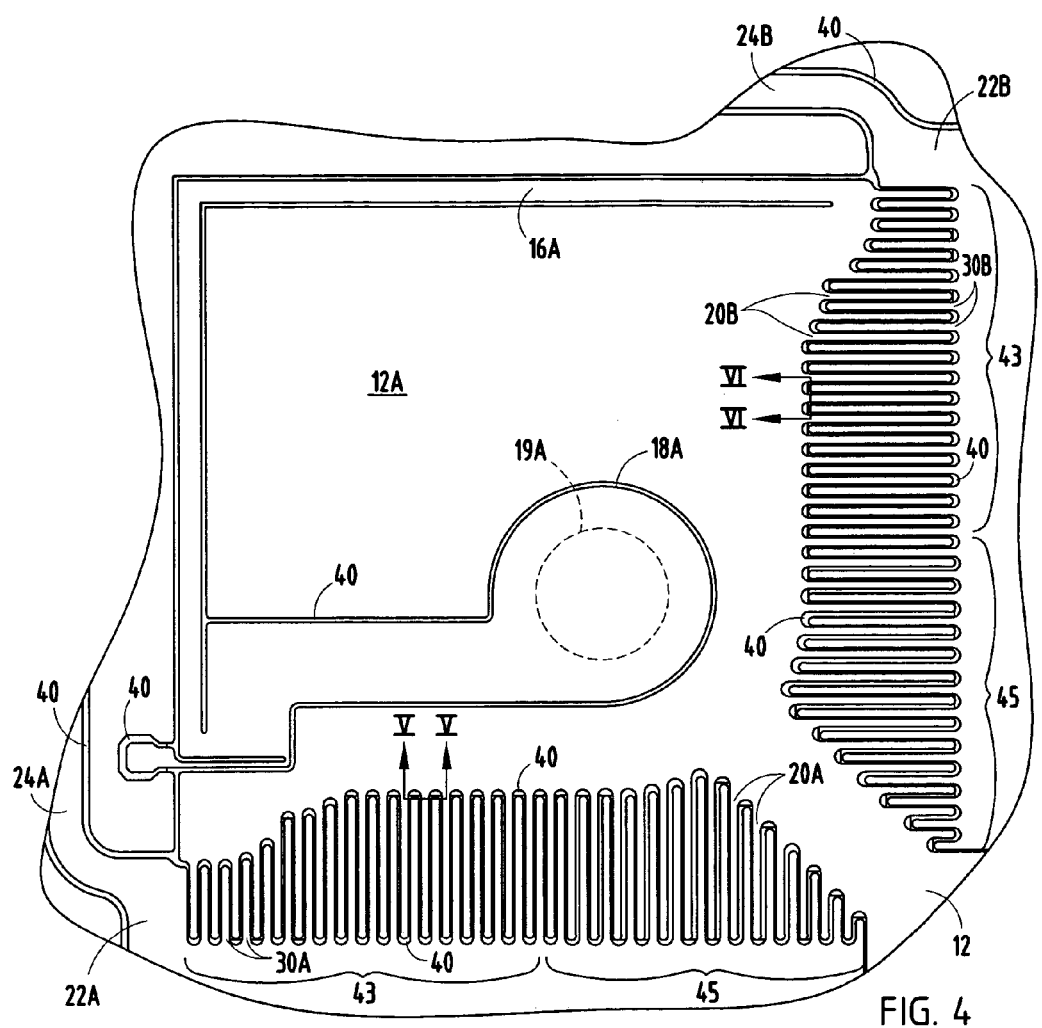
FIG. 4 is an enlarged view of section IV of FIG. 1.

The electrical components formed in the EPI device layer over substrate 14 are formed by an etching process which removes material in the EPI layer, such as to form trenches. The input lines 24A–24D, input pads 26 and 28, output line 32, output pad 34, tethers 16A–16D, isolators 36, and gaps between adjacent capacitive plates are formed as trenches 40 as shown in FIG. 4. Trenches 40 provide both physical separation and electrical isolation. The reduced height for certain capacitive plates is formed by partially etching the capacitive plates on the EPI layer from the top side with a vertical mask and etch module to achieve the desired height.

With particular reference to FIG. 4, the adjacent fixed and movable capacitive plates 30A–30B and 20A–20B are shown spaced from each other by etched trenches 40 which provide dielectric air gaps. The gaps allow the movable capacitive plates 20A–20B to move relative to the fixed capacitive plates 30A–30B. The adjacent fixed and movable capacitive plates 30A–30B and 20A–20B are separated by a greater distance on one side only in region 45, which enables the capacitors formed thereby to serve as self-test capacitors that enable testing of the accelerometer 10 with self-test processing circuitry. The remaining adjacent fixed and movable capacitive plates 30A–30B and 20A–20B in region 43, which is outside of region 45, are spaced from each other on each side by equal distances, according to one embodiment. Capacitive plates 30C–30D and 20C–20D are similarly spaced from each other.

The linear accelerometer 10 according to the present invention employs fixed and movable capacitive plates interdisposed between adjacent opposing plates to form multiple banks of variable capacitors that sense both magnitude and direction of acceleration in the sensing Z-axis. Adjacent fixed and movable capacitive plates are configured having different heights to enable both the magnitude and direction of acceleration to be sensed. That is, the linear accelerometer 10 is able to sense not only magnitude of acceleration, but also the direction of the acceleration, e.g., upward or downward direction of vertical acceleration.

With particular reference to FIG. 2, the first and third movable capacitive plates 20A and 20C are shown formed having a height that is less than the height of the first and third fixed capacitive plates 30A and 30C. The reduced height of movable capacitive plates 20A and 20C is realized by etching the EPI layer on the top surface of the capacitive plates 20A and 20C to a reduced height. This height variance is further illustrated with capacitive plates 20A and 30A in FIGS. 5A–5C. Capacitive plates 20C and 30C are formed similar to capacitive plates 20A and 30A.

Figure 5A:
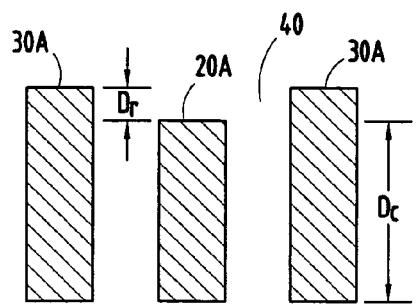
FIGS. 5A–5C are cross-sectional views taken through lines V—V of FIG. 4 illustrating the fixed and movable capacitive plates subjected to no vertical acceleration in FIG. 5A, downward acceleration in FIG. 5B, and upward acceleration in FIG. 5C.

As seen in FIG. 5A, capacitive plates 20A and 30A are formed so that the bottom edge of each adjacent plate is substantially at the same elevation when there is no vertical acceleration present. The fixed capacitive plates 30A have a height that is higher than the reduced height movable capacitive plates 20A by a predetermined distance $D_r$. The capacitive plates 20A–20D and 30A–30D may have a uniform doping (e.g., P+ or N+) or two different dopings (e.g., P+/N+ or P+(P++)/N+(N++)), according to one embodiment.

Figure 5B:
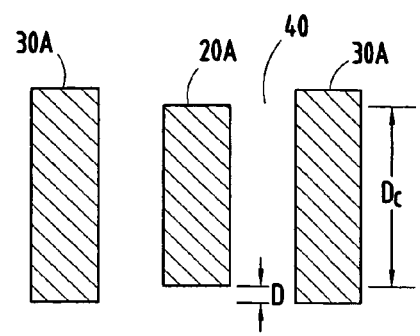
Figure 5C:
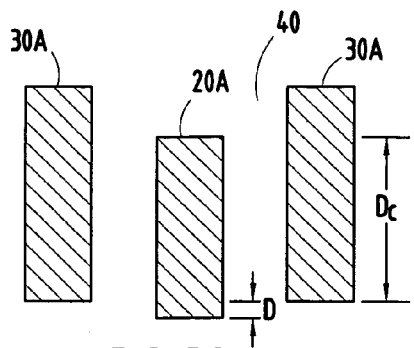

Capacitive plates 20A and 30A have an effective overlapping area that determines the amount of capacitance generated by that bank of capacitors. The maximum area of the resulting capacitors is functionally the area of the smallest plate. The capacitance therefore is a function of the overlapping height $D_C$ of adjacent opposing capacitor plates. When the inertial mass 12 moves upward by distance D due to downward acceleration, as seen in FIG. 5B, the overlapping height $D_C$ and area of the capacitor plates 20A and 30A remains the same (i.e., unchanged). When this happens there is no change in capacitance generated by these capacitive plates. When the inertial mass 12 moves downward by distance D due to upward acceleration, as seen in FIG. 5C, the overlapping height $D_C$ and area of the capacitor plates 20A and 30A is reduced. This causes a reduction in the capacitance generated by these capacitive plates. Thus, a change in capacitance of capacitive plates 20A and 30A is indicative of the direction as well as magnitude of the sensed acceleration.

With reference to FIG. 3, the second and fourth movable capacitive plates 20B and 20D are shown having a height that is greater than the height of the second and fourth fixed capacitive plates 30B and 30D. The reduced height of the fixed capacitive plates 30B and 30D is realized by etching the EPI layer on the top surface of the capacitive plates connected to the second and fourth fixed electrodes 22B and 22D to a reduced height. This height variance is further illustrated with capacitive plates 20B and 30B in FIGS. 6A–6C. Capacitive plates 20D and 30D are formed similar to capacitive plates 20A and 30A.

Figure 6A:
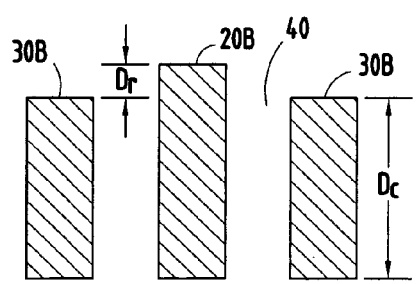
FIGS. 6A–6C are cross-sectional views taken through lines VI—VI of FIG. 4 illustrating the fixed and movable capacitive plates subjected to no acceleration in FIG. 6A, downward acceleration in FIG. 6B, and upward acceleration in FIG. 6C.

As seen in FIG. 6A, capacitive plates 20B and 30B are formed so that the bottom edge of each adjacent plate is substantially at the same elevation when there is no vertical acceleration present. The movable capacitive plates 20B have a height that extends higher than the reduced height fixed capacitive plates 30B by a predetermined distance $D_r$.

Figure 6B:
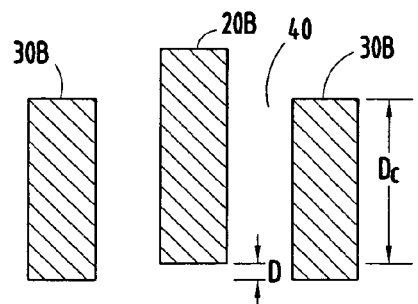
Figure 6C:
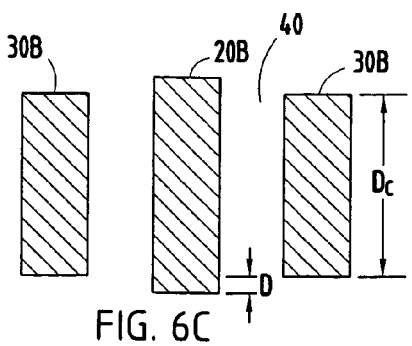

Capacitive plates 20B and 30B have an effective overlapping area that determines the amount of capacitance generated by that bank of capacitors. The maximum area of the resulting capacitors is functionally the area of the smallest plate and, therefore, the capacitance is a function of the overlapping height $D_C$ of adjacent opposing capacitor plates. When the inertial mass 12 moves upward by distance D due to downward acceleration, as seen in FIG. 6B, the overlapping height $D_C$ and area of the capacitor plates 20B and 30B is reduced. This causes a reduction in the capacitance generated by these capacitive plates. Thus, a change in capacitance of capacitive plates 20B and 30B is indicative of the direction as well as magnitude of the sensed acceleration. When the inertial mass 12 moves downward by distance D due to upward acceleration, as seen in FIG. 6C, the overlapping height $D_C$ and area of the capacitor plates 20B and 30B remains the same (i.e., unchanged). When this happens there is no change in capacitance generated by these capacitive plates. Thus, no signal contribution to direction or magnitude is provided by this set of capacitors.

The capacitive plates 20A–20D and 30A–30D may be configured in various shapes and sizes. According to one embodiment, capacitive plates 20A–20D and 30A–30D are generally rectangular. The reduced height capacitive plates may be reduced in height up to one-half the height of the extended height capacitive plates, according to one embodiment. In one example, the reduced height capacitive plates have a height of twenty-eight micrometers (28 µm) as compared to a height of thirty micrometers (30 µm) for the extended height capacitive plates.

Figure 7:
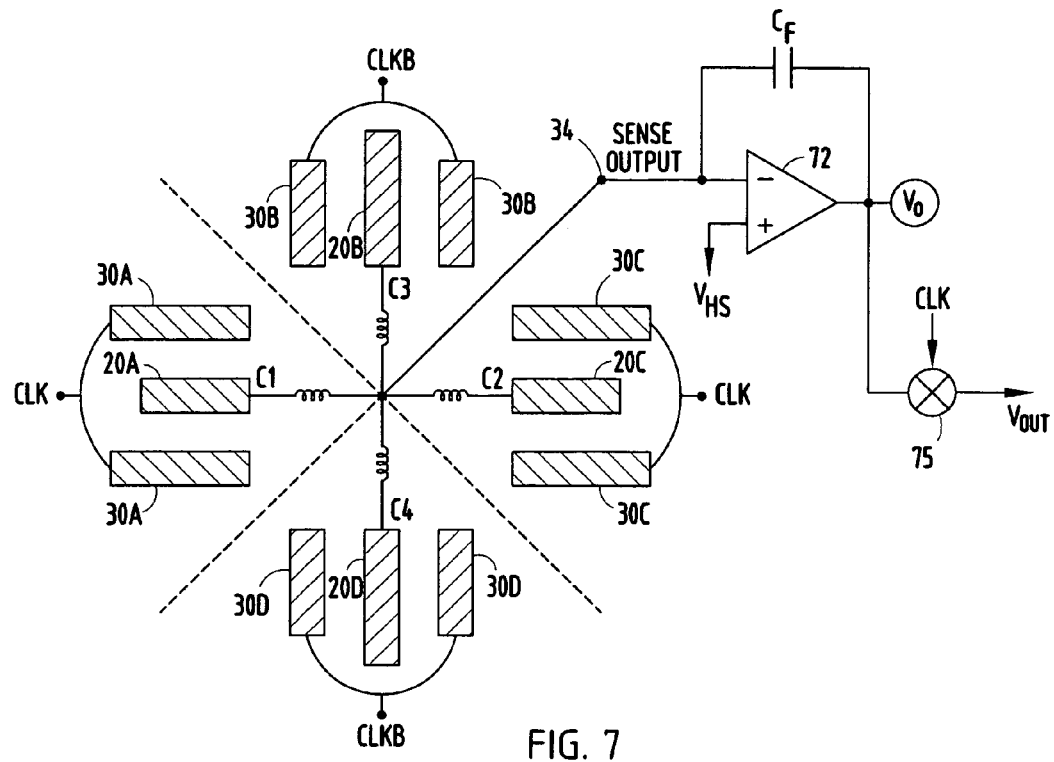
FIG. 7 is a exemplary block/circuit diagram illustrating processing of the sensed capacitance output.

Referring to FIG. 7, a simplified representation of the accelerometer 10 is shown electrically coupled to signal processing circuitry, according to one embodiment. The accelerometer 10 is generally represented as an electrical equivalent circuit having four electromechanical capacitors C1–C4 representing the four banks of variable capacitors. Capacitor C1 is formed by capacitive plates 20A and 30A, capacitor C2 is formed by capacitive plates 20C and 30C, capacitor C3 is formed by capacitive plates 20B and 30B, and capacitor C4 is formed by capacitive plates 20D and 30D. Thus, capacitors C1 and C2 receive input clocked signal CLK and capacitors C2 and C3 receive input clocked signal CLKB.

The sensed output signal received at output pad 34 is input to a charge amplifier 72 and is further processed by a demodulator 75 shown receiving clocked signal CLK. The feedback path, $C_F$ in the charge amplifier 72, serves to prevent overloads in the high frequency front-end amplifier section and to minimize signal distortions due to high frequency signal components. The charge amplifier 72 output voltage $V_O$ is inputted to the demodulation circuit 75 to generate the output voltage denoted by $V_{OUT}$. The amplitude and sign of voltage $V_{OUT}$ represent the amplitude and direction of the vertical acceleration applied to the accelerometer 10.

The output voltage $V_O$ may be represented by the following equation: $V_O=[(C3+C4)-(C1+C2)]/C_F$. When the inertial mass 12 moves downward, output voltage $V_O$ may be represented by the following simplified equation: $V_O=-(2*\Delta C)*CLK/C_F$, where $\Delta C$ represents the change in capacitance of capacitors C3 and C4. When the inertial mass 12 moves upward, then the output voltage $V_O$ may be represented by the following simplified equation: $V_O=+(2*\Delta C)*CLK/C_F$, where $\Delta C$ represents the change in capacitance of capacitors C1 and C2.

Accordingly, the accelerometer 10 of the present invention advantageously measures acceleration applied in either direction along the vertical sensing axis. By employing movable capacitive plates having a height different than the adjacent fixed capacitive plates, the accelerometer 10 senses magnitude of acceleration as well as the direction of the acceleration along the sensing axis. This is achieved by applying clocked signals CLK and CLKB, which are one hundred eighty degrees (180°) out-of-phase with each other, as inputs to the variable capacitors. The accelerometer 10 advantageously provides high gain to linear acceleration sensed along the sensing Z-axis, while maintaining very low other linear and rotational cross-axis sensitivities.

While the accelerometer 10 is shown and described herein as a single-axis linear accelerometer, it should be appreciated that accelerometer 10 may be configured to sense acceleration in other sensing axes, such as the X- and Y-axes. Thus, the accelerometer 10 could be configured as a three-axis accelerometer. It should further be appreciated that the accelerometer 10 may be configured to sense angular acceleration or angular velocity.

Figure 8:
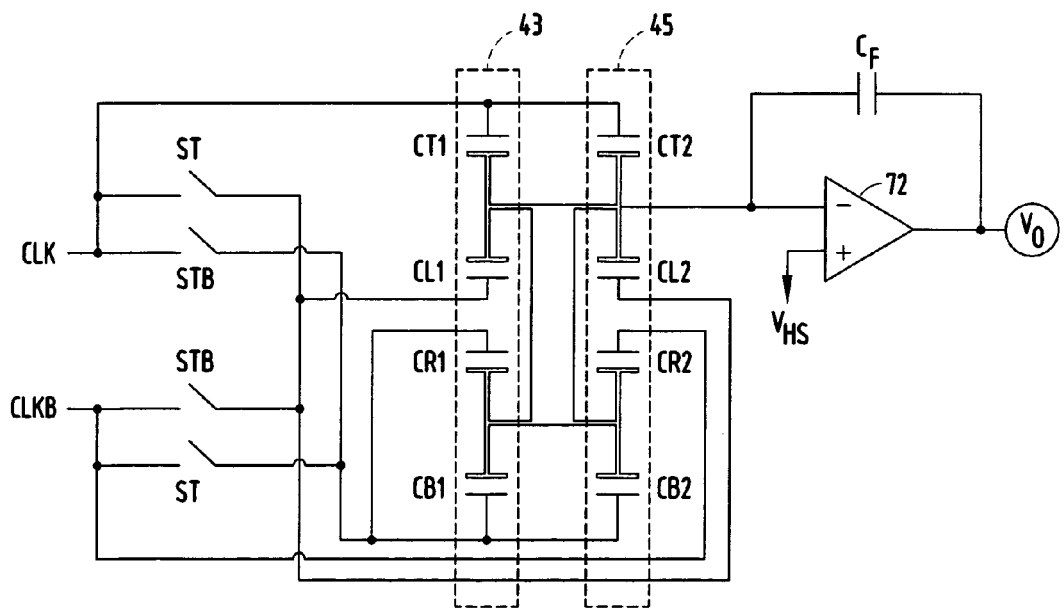
FIG. 8 is a block/circuit diagram further illustrating processing self-test circuitry coupled to the accelerometer.

The accelerometer 10 may be tested following its fabrication by employing a self-test circuit as shown in FIG. 8, according to one embodiment. The accelerometer 10 is generally illustrated having normal operation capacitive plates forming variable capacitors in region 43 and normal operation plus self-test capacitive plates forming variable capacitors in region 45. As mentioned above, the variable capacitors in region 43 are formed of capacitive plates that are linear and have equal gap spacings between each of the adjacent movable capacitive plates and the fixed capacitive plates. This gap spacing arrangement results in no response from motion along the X- and Y-axes, and allows for a change in capacitance when subjected to the vertical acceleration along the Z-axis. The normal plus self-test capacitive plates in conjunction with the input clock arrangement maximizes the main axis response while minimizing off axis responses.

The self-test operation can be performed by applying a clocked signal CLK to variable capacitor C1 and applying its clock compliment CLKB (one hundred eighty degrees (180°) out-of-phase) to variable capacitor C2. The average value of the clocked signal CLK and its compliment signal CLKB is designed to be different just as the self-test initiated and these average values are chosen for a desired electrostatically induced inertial mass displacement in the X-axis or Y-axis direction. Therefore, the X- and Y-mode shape may be designed in relation to the Z-mode shape such that an optimum trade-off is realized between the main sensing axis and cross-axis responses. Similarly, clocked signals CLK and CLKB are applied across variable capacitors C3 and C4.

The sensed output voltage is further processed as explained in connection with FIG. 7 to generate an output voltage output $V_{OUT}$.

The accelerometer 10 shown provides four variable capacitors arranged in four symmetric quarters. However, it should be appreciated that two or more variable capacitors may be provided in other symmetries, such as one-half symmetries. It should also be appreciated that additional signal pads may be formed on the accelerometer 10. This may include a low impedance electrical ground connection to minimize electrical feedthrough components, an isolation pad, and a pad to create pseudo-differential electrical connection(s) between the sensor 10 and readout electronic circuitry of the signal of signal processing integrated circuitry (IC).

Process of Manufacturing Microsensor

Referring now to FIG. 9 and FIGS. 10A–10H, a process 100 is illustrated for fabricating a microsensor, such as the linear accelerometer 10 described above. The microsensor is a micro-electromechanical system (MEMS) sensor that is fabricated on the crystal silicon substrate 14. While the fabrication process 100 is described herein according to one example to form the linear accelerometer 10, it should be appreciated the fabrication process may be used to form other microsensors.

The fabrication process 100 employs a trench etching process, such as deep reactive ion etching (DRIE) and bond-etch back process. The etching process generally includes etching out a pattern from a doped material in EPI device layer 56 suspended over subsurface cavity 50 formed in substrate 14. The fabrication process 100 according to the embodiment shown provides for a top side etching process which employs a vertical mask and etch module for performing a top side mask and etch to remove material from the top side surface of epitaxial (EPI) device layer 56 to achieve a reduced height dimension.

Figure 9:
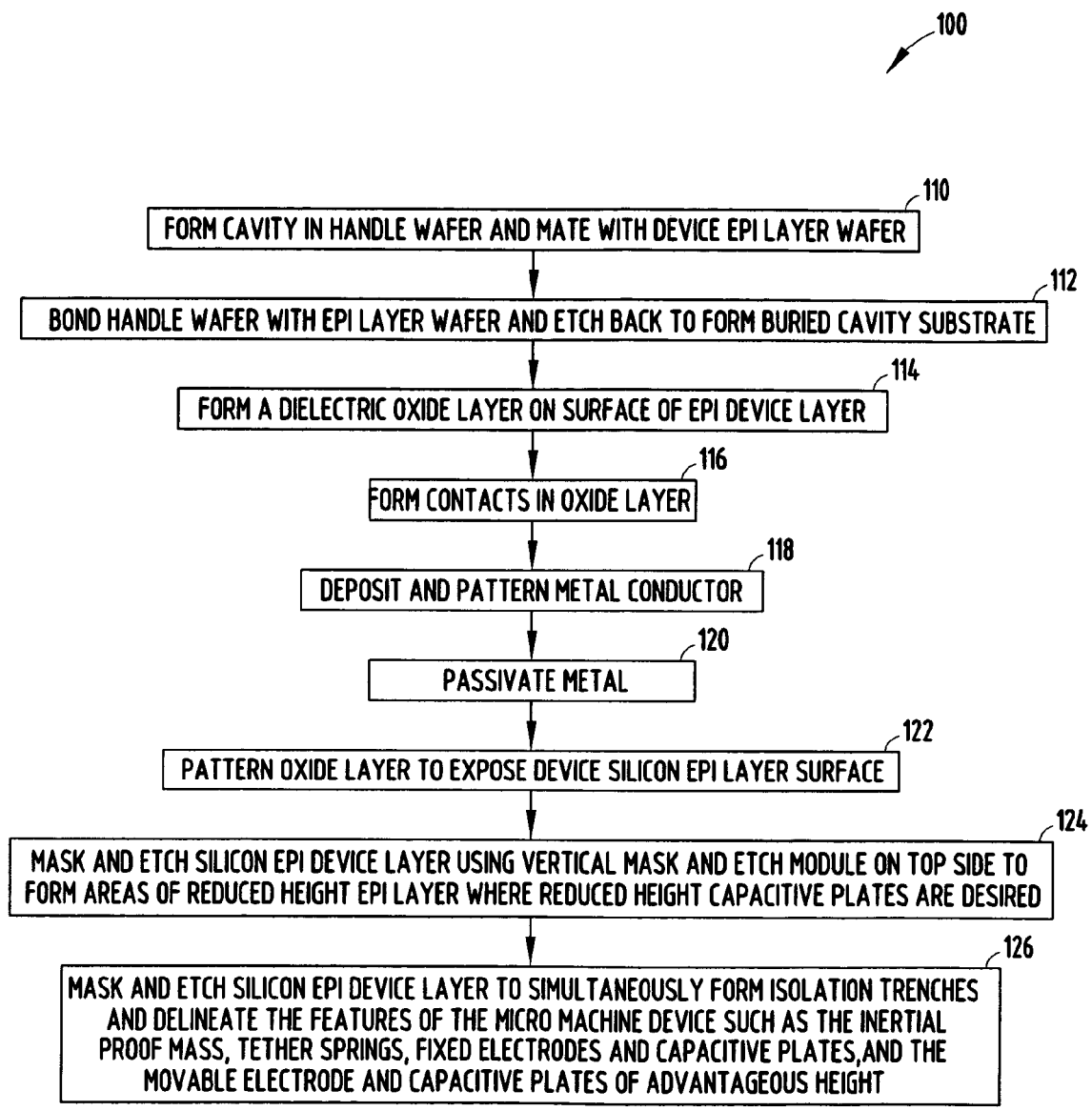
FIG. 9 is a flow diagram illustrating process steps for fabricating the accelerometer according to the present invention.
Figure 10A:
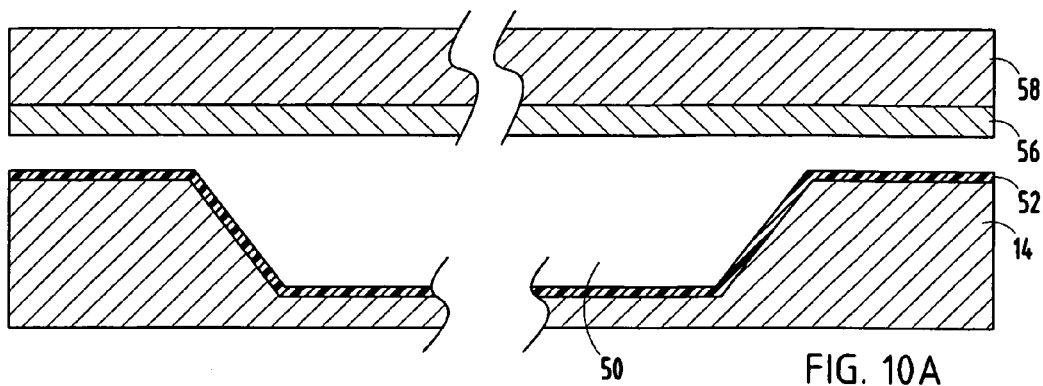
FIGS. 10A–10H are cross-sectional views further illustrating the process steps for fabricating the accelerometer according to the present invention.

The sequence of the steps for fabricating the microsensor according to the fabrication process 100 are illustrated in FIG. 9, according to one embodiment. FIGS. 10A–10H further illustrate the fabrication process of FIG. 9 for forming a specific microsensor, particularly the linear accelerometer 10. Process 100 is shown beginning with step 110 of forming subsurface cavity 50 in the top surface of handle wafer substrate 14, and mating the handle wafer substrate 14 with the device EPI layer wafer 56. This step is generally shown in FIG. 10A. The handle wafer substrate 14 may include silicon or any other suitable support substrate. Grown on top surface of substrate 14 is an oxide bond layer 52. Oxide bond layer 52 may include silicon dioxide or any other suitable dielectric material for forming a silicon bond.

The EPI device layer 56 is shown having an upper wafer substrate 58 formed on the top surface thereof. EPI device layer 56 may include a single crystal EPI layer of silicon, according to one embodiment. In one example, EPI layer 56 is thirty (30) micrometers thick. The upper wafer substrate 58 allows for ease in handling the EPI device layer 56 during the fabrication process.

Figure 10B:
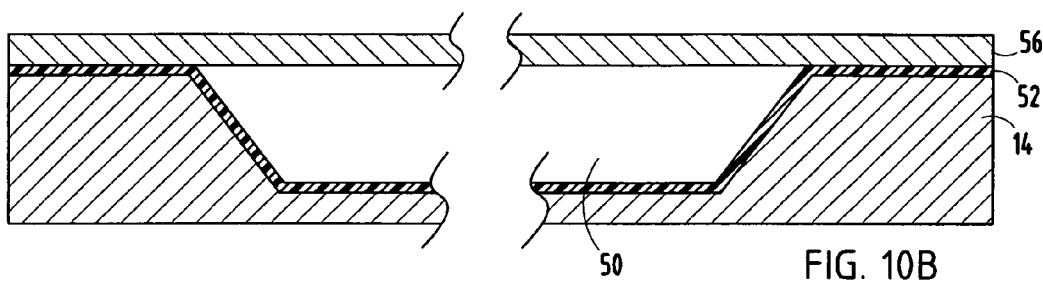

Fabrication process 100 includes step 112 of bonding the handle wafer substrate 14 to the EPI layer 56 and etching back the upper wafer substrate 58 to leave the EPI layer 56 formed over the cavity substrate. This step 112 is illustrated in FIG. 10B. Any appropriate silicon bonding method may be employed as is well-known in the art. Presumably, the EPI layer wafer 56 is etched back to form a requisite device thickness. Etch stops for chemical etch back of bonded silicon layers are known in the art. Dopent concentration-dependent silicon etches are also known in the art. Concentration-dependent selective removal of a layer of one doping type material from the top of the second doping typing material (i.e., P+ removed selectively from N-type material or N-type material selectively removed from on top of P-type material) is further known in the art.

The fabricated microsensor, particularly the linear accelerometer 10, may employ a P-type device EPI layer 56, according to one embodiment. The etch stop material may be a counter-doped P++ layer, according to one embodiment. Process steps of removing the P++ layer from the underlying P-type EPI layer are well-known in the art.

Figure 10C:
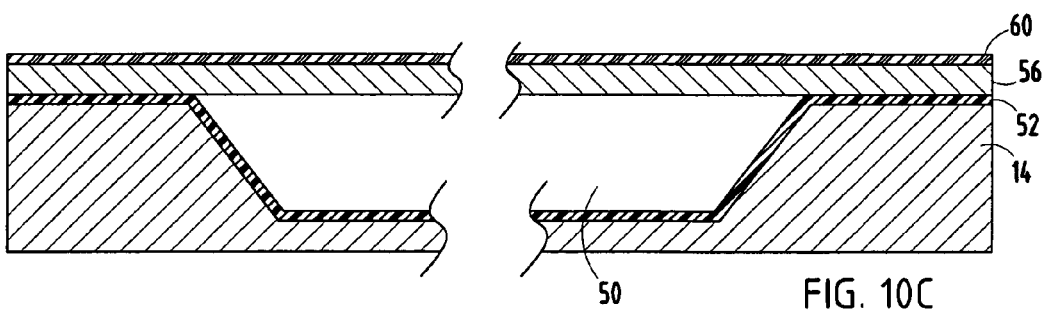

Once the EPI layer wafer 56 is etched back to the desired device layer thickness (e.g., thirty (30) micrometers), fabrication process 100 forms a dielectric oxide layer 60 on the top surface of the EPI device layer 56 in step 114. This step is seen in FIG. 10C. Layer 60 may include silicon dioxide or any other suitable dielectric medium.

Figure 10D:
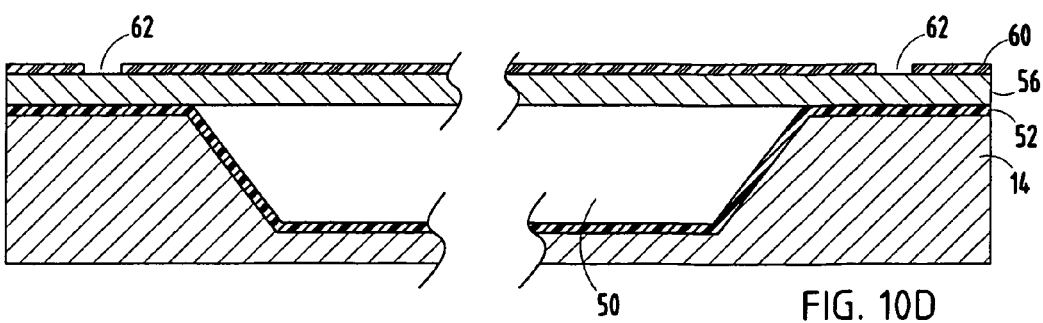
Figure 10E:
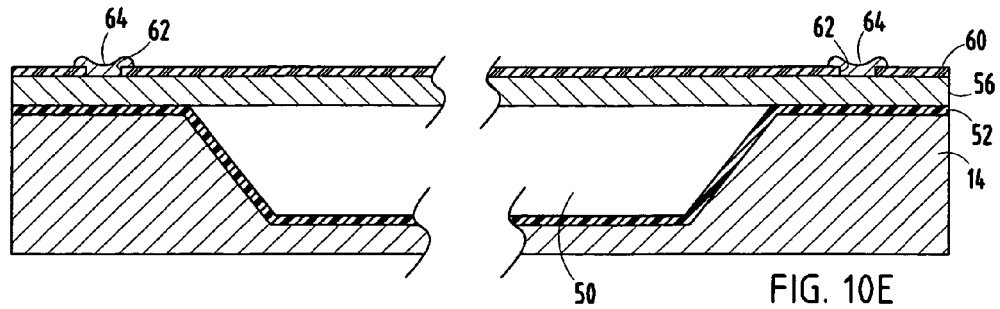

Next, as seen in FIG. 10D, contacts 62 in the form of openings are formed in the oxide layer according to step 116. The contacts 62 may be formed by etching. In step 118, a metal conductor 64 is deposited and patterned in the contacts 62 formed on oxide layer 60, as seen in FIG. 10E. Additionally, the patterned metal 64 may further be passivated in step 120. The patterned metal 64 may be aluminium or alloys of aluminium and silicon and other advantageous materials deposited by known sputtering or evaporation techniques. Accordingly, metal conductors 64 are appropriately routed on top of the EPI device layer 56.

Figure 10F:
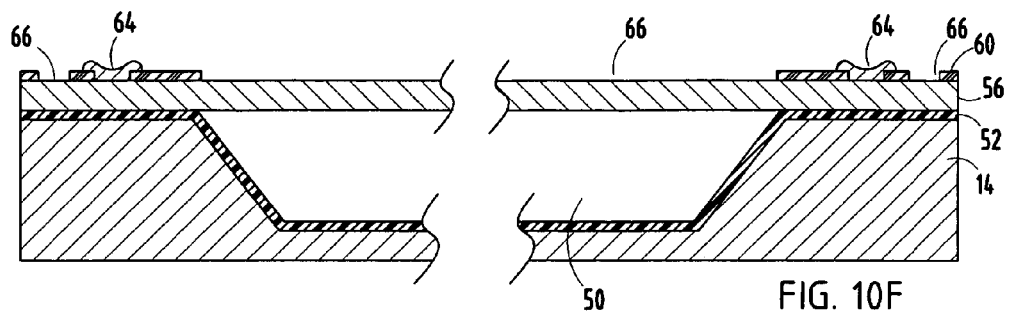

In step 122, microsensor fabrication process 100 patterns the oxide layer 60 to expose portions of the top surface of device silicon EPI layer 56. This exposes regions 66 on the top side of EPI layer 60 as seen in FIG. 10F. The exposed regions 66 include the overlying region where device components, such as capacitive plates and isolation trenches, are to be formed.

Figure 11:
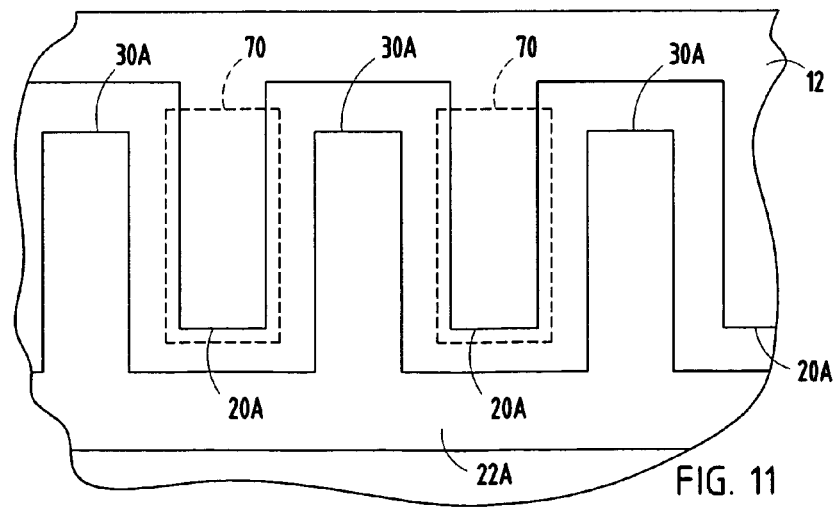
FIG. 11 is a top view of a portion of the accelerometer illustrating a mask and etch module for forming the capacitive plates of different heights.
Figure 10G:
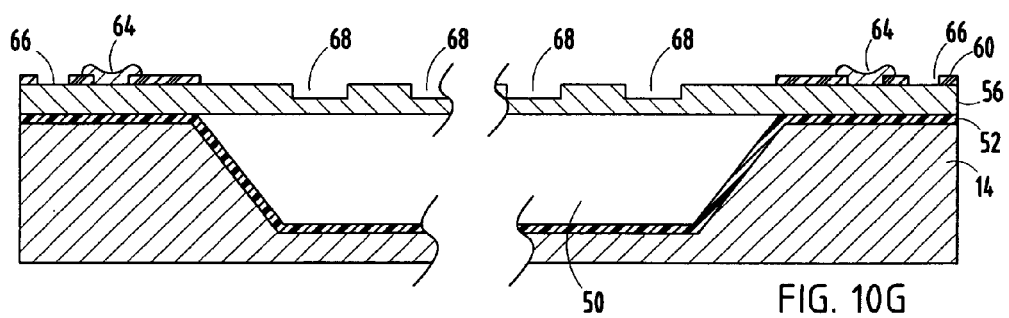
Figure 10H:
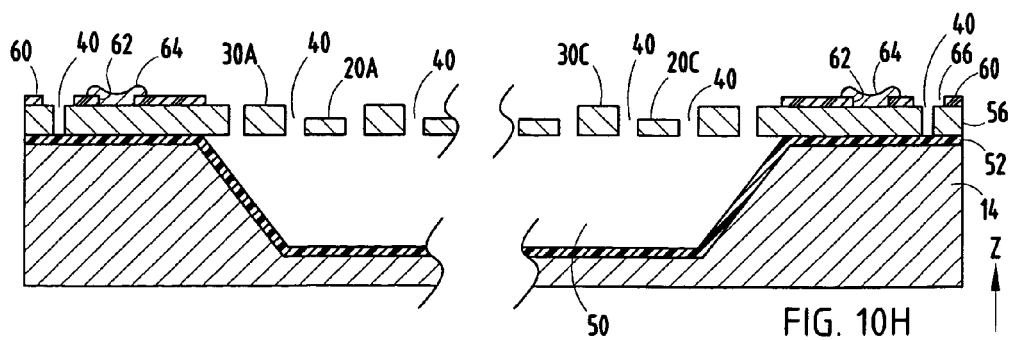

Referring to FIG. 10G and step 124 of the fabrication process 100 shown in FIG. 9, the silicon EPI device layer is masked and etched using a vertical mask and etch module on the top side to form areas of reduced height EPI layer 56. The reduced height EPI layer 56 is formed in regions where reduced height capacitive fingers or plates are desired, according to the embodiment shown. The reduced height regions are shown by etched portions 68. The step of masking and etching EPI layer 56 to form reduced height regions 68 is achieved by employing a mask and etch module 70 seen in FIG. 11. In the embodiment shown, the vertical etch and mask module 70 is placed on top of the region 68 that is to be etched to form the reduced height region(s). In this particular example, the vertical mask and etch module 70 is placed on top of the movable capacitive plates 20A to etch and remove material from the EPI layer to form reduced height capacitive plates. It should be appreciated that the vertical etching mask module 70 likewise is placed on top of movable capacitive plates 20C and fixed capacitive plates 30B and 30D, to form the reduced height capacitive plates described in connection with the linear accelerometer 10.

The vertical mask and etch module 70 is a top side processed module that may employ a photoresist mask applied to the EPI layer 56, followed by a shallow silicon etch. The vertical mask and etch module 70 creates a step in the silicon on the top side. The silicon etch step may include any of dry, wet or vapor phase etches, as is known in the art. The etch may be isotropic or anisotropic. If an isotropic etch is employed, the trenches that separate capacitive plates on the accelerometer 10, as well as the air gap distance between adjacent capacitive plates 40, should be sized appropriately. Once the etch is performed, the photoresist mask may be stripped from the surface, as is known in the art.

According to one example, the vertical mask and etch step may include spinning a photoresist, and masking areas to expose areas to be etched. This may include rinsing the photoresist material away from the areas to be etched. An etchant, such hydrofluoric (HF) acid according to a wet etching embodiment, is then applied to the areas to be etched. A desired depth etch may be achieved based on the etch rate of the etchant acid by controlling the time that the etchant acid is applied to the non-masked surface. Any appropriate silicon etch, such as a wet, dry or vapor etch, may be used as is known in the art.

The fabrication process 100 further includes step 126 of masking and etching the silicon EPI device layer to simultaneously form the isolation trenches 40, and delineate the various features of the micro-machined device in step 126. These features may include forming the inertial proof mass 12, tether springs 16A–16D, fixed electrodes and capacitive plates and the movable electrode and capacitive plates. These various features may be formed by masking and etching and is known in the art. According to one embodiment, this process step uses DRIE etching to do this etch due to its anisotropic characteristic and high aspect ratio (depth-to-surface width) ability. Following completion of fabrication process 100, the fabricated microsensor may be capped with an overlying cover to prevent contamination and moisture intrusion.

Accordingly, the process 100 of the present invention advantageously provides for a top side microsensor fabrication technique. The process advantageously allows for the formation of different height structures on the device layer, without requiring added bottom side processing steps and equipment.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. A method of making a microsensor comprising the steps of:
    forming at least one cavity in the top surface of a substrate;
    providing a device layer on top of the substrate extending over the cavity, the device layer comprises a lower surface overlaying the cavity that is substantially planar;
    forming at least one reduced height region in a top surface of the device layer using a mask and etch module, wherein the mask and etch module etches material from the top surface of the device layer; and
    forming one or more trenches in the device layer to form one or more components of a microsensor.

2. The method as defined in claim 1 further comprising the steps of:
    forming a dielectric layer on top of the device layer;
    etching one or more regions in the dielectric layer to form one or more openings; and
    forming metal in select one or more regions to contact the device layer.

3. The method as defined in claim 1, wherein the device layer comprises a conductive EPI material.

4. The method as defined in claim 3, wherein the conductive EPI material comprises silicon.

5. The method as defined in claim 1, wherein the step of forming at least one reduced height region in the device layer comprises:
    applying a photoresist material on a top surface of the device layer;
    exposing one or more mask areas; and
    etching select areas to realize the reduced height.

6. The method as defined in claim 5, wherein the step of etching comprises etching for a predetermined time to achieve a desired height etch.

7. The method as defined in claim 1, wherein the method forms an accelerometer microsensor.

8. The method as defined in claim 7, wherein the accelerometer comprises a linear accelerometer.

9. The method as defined in claim 1, wherein the microsensor senses dynamic motion in a sensing axis perpendicular to the substrate.

10. The method as defined in claim 1, wherein said step of forming one or more trenches comprises etching the device layer into a portion of the reduced height region.

11. A method of making a microsensor comprising the steps of:
    forming at least one cavity in the top surface of a substrate;
    providing a conductive device layer on top of the substrate extending over the cavity, the device layer comprises a lower surface overlaying the cavity that is substantially planar;
    forming at least one reduced height region in a top surface of the device layer using a mask and etch module, wherein the mask and etch module etches material from the top surface of the device layer; and
    forming trenches in the device layer that define a plurality of capacitive plates arranged to provide a capacitive coupling, wherein the capacitive coupling serves to sense acceleration.

12. The method as defined in claim 11, wherein the step of forming trenches further comprises forming a movable electrode and one or more fixed electrodes, wherein the plurality of capacitive plates include fixed and movable capacitive plates.

13. The method as defined in claim 11 further comprising the steps of:
    forming a dielectric layer on top of the conductive device layer;
    etching one or more regions in the dielectric layer to form one or more openings; and
    forming metal in select one or more regions to contact the conductive device layer.

14. The method as defined in claim 11, wherein the step of forming at least one reduced height region in the conductive device layer comprises:
    applying a photoresist material on a top surface of the conductive device layer;
    exposing one or more mask areas; and
    etching select areas to realize the reduced height.

15. The method as defined in claim 14, wherein the step of etching comprises applying an etchant for a predetermined time to achieve a desired height etch.

16. The method as defined in claim 11, wherein the method form an accelerometer microsensor.

17. The method as defined in claim 16, wherein the accelerometer comprises a linear accelerometer.

18. The method as defined in claim 11, wherein the microsensor senses dynamic motion in a sensing axis perpendicular to the substrate.

19. The method as defined in claim 11, wherein said step of forming one or more trenches comprises etching the device layer into a portion of the reduced height region.

* * * * *